(12) United States Patent
Purpura

(10) Patent No.: US 9,202,474 B2
(45) Date of Patent: Dec. 1, 2015

(54) EFFECTING VOICE COMMUNICATION IN A SOUND-RESTRICTED ENVIRONMENT

(71) Applicant: The Boeing Company, Seal Beach, CA (US)

(72) Inventor: William J. Purpura, Anaheim, CA (US)

(73) Assignee: The Boeing Company, Chicago, IL (US)

( * ) Notice: Subject to any disclaimer, the term of this patent is extended or adjusted under 35 U.S.C. 154(b) by 81 days.

(21) Appl. No.: 14/187,489

(22) Filed: Feb. 24, 2014

(65) Prior Publication Data

US 2015/0243296 A1    Aug. 27, 2015

(51) Int. Cl.
| | |
|---|---|
| *H04R 1/10* | (2006.01) |
| *G10L 21/02* | (2013.01) |
| *H03G 3/32* | (2006.01) |
| *H03G 3/00* | (2006.01) |
| *H04R 5/033* | (2006.01) |
| *H04R 3/00* | (2006.01) |
| *H04R 3/02* | (2006.01) |
| *G10K 11/178* | (2006.01) |

(52) U.S. Cl.
CPC ............ *G10L 21/02* (2013.01); *G10K 11/1788* (2013.01); *H03G 3/001* (2013.01); *H03G 3/32* (2013.01); *H04R 1/1041* (2013.01); *H04R 1/1083* (2013.01); *H04R 3/005* (2013.01); *H04R 3/02* (2013.01); *H04R 5/033* (2013.01)

(58) Field of Classification Search
None
See application file for complete search history.

(56) References Cited

U.S. PATENT DOCUMENTS

| | | | | |
|---|---|---|---|---|
| 6,061,456 | A  * | 5/2000 | Andrea et al. | 381/71.6 |
| 8,195,467 | B2 * | 6/2012 | Mozer et al. | 704/275 |
| 2007/0286386 | A1 | 12/2007 | Denenberg et al. | |
| 2000/0171670 | | 7/2009 | Bailey et al, | |
| 2009/0185704 | A1 * | 7/2009 | Hockley | 381/316 |
| 2011/0026739 | A1 * | 2/2011 | Thomsen et al. | 381/120 |
| 2013/0039501 | A1 | 2/2013 | Grimes et al. | |

OTHER PUBLICATIONS

European Search Report dated Jun. 25, 2015 for Appfication No. 15156075.2.

* cited by examiner

*Primary Examiner* — Muhammad N Edun
(74) *Attorney, Agent, or Firm* — Womble Carlyle Sandridge & Rice, LLP; Andrew Spence

(57) ABSTRACT

A headset is provided for use by a user to effect voice communication in a sound-restricted environment. The headset includes a microphone that converts the user's voice at a first sound level to produce a first audio signal. The headset also includes an apparatus with circuitry that amplifies the first audio signal to produce a second audio signal representing that produced by conversion of the user's voice at a greater, second sound level by the microphone, and outputs the second audio signal for communication to a telecommunications device or sound recording device. The circuitry also receives a third audio signal and measures a third sound level thereof. The circuitry produces a feedback signal in at least one instance in which the third sound level is greater than a threshold sound level that is less than the second sound level, and outputs the feedback signal for communication to the user.

23 Claims, 5 Drawing Sheets

EFFECTING VOICE COMMUNICATION IN A SOUND-RESTRICTED ENVIRONMENT

TECHNOLOGICAL FIELD

The present disclosure relates generally to voice communication and, in particular, to voice communication via mobile devices in a sound-restricted environment such as onboard commercial vehicles like aircraft or via desk-type phones or mobile-telephone devices within high density open office spaces or other public areas where speaker voice levels require some level of restriction for overall sound level control and/or speaker communication privacy.

BACKGROUND

There are a number of sound-restricted environments where people may be prohibited or discouraged from using their mobile telephones to carry on a conversation, or may be otherwise prohibited or discouraged from speaking at a normal conversational level. One typical example of such an environment is onboard a commercial vehicle like an aircraft. In-flight mobile-telephone use is currently prohibited onboard commercial aircraft, but proposals have been introduced to begin allowing such use.

While allowing passengers onboard commercial aircraft to use their mobile telephones in flight has been greeted positively by some, and negatively by others. Some airlines that are positioned to provide the necessary infrastructure to enable passengers to make mobile telephone calls see the potential for an added source of revenue. Other airlines have raised concerns for passengers who may be bothered by the added noise that may be created within the confined space of the cabin. Further, some airline employee union members have raised concerns of having to arbitrate disputes between passengers making telephone calls and those who are bothered by the audible noise or personal content generated by those on both sides of the telephone conversation.

Therefore, it may be desirable to have an apparatus and method that allows someone in a sound-restricted environment to use their mobile telephone to carry on a conversation, while conversing at a level low enough to be unintelligible or distracting to others around them, and while still outputting their voice at a normal sound level for the person on the receiving end of the conversation.

BRIEF SUMMARY

According to one aspect of example implementations of the present disclosure, a headset is provided for use by a user to effect voice communication in a sound-restricted environment. The headset includes a housing that supports a microphone and carries an apparatus including circuitry. The microphone is configured to convert the user's voice at a first sound level to produce a first audio signal. The circuitry is configured to receive the first audio signal. The circuitry is configured to amplify the first audio signal to produce a second audio signal representing an audio signal produced by conversion of the user's voice at a greater, second sound level by the microphone. The circuitry is configured to then output the second audio signal for communication to at least one of a telecommunications device or a sound recording device. To this end, the headset also includes a wireless or wired communication interface configured to communicate the second audio signal to the telecommunications device or the sound recording device.

According to this aspect of example implementations, the circuitry is also configured to receive a third audio signal and measure a third sound level thereof, produce a feedback signal in at least one instance in which the third sound level is greater than a threshold sound level that is less than the second sound level, and output the feedback signal for communication to the user. Here, the third audio signal and third sound level may be the same as or different from the first audio signal and first sound level. In this regard, in some examples in which the third audio signal and third sound level are different from the first audio signal and first sound level, the headset may further include another microphone configured to convert background noise to produce the third audio signal. In these examples, the circuitry may be configured to measure the third sound level from a portion of the background noise including the user's voice at the third sound level.

In some examples, the headset may further include a sound shield disposed proximate the microphone and configured to at least partially muffle the user's voice from propagating beyond the microphone in the sound-restricted environment.

In some examples in which the headset further includes another microphone configured to convert background noise to produce the third audio signal, the circuitry may be configured to measure an overall background sound level from the background noise. In these further examples, the threshold sound level may be dynamic and have a direct relationship with the overall background sound level.

In some examples, the headset may further include an input user interface coupled to the apparatus. In these examples, the input user interface may be configured to receive user-selection of the threshold sound level from a plurality of possible threshold sound levels. Additionally or alternatively, the input user interface may be configured to receive user-selection of the second sound level from a plurality of possible second sound levels.

In some examples, the headset may further include an output user interface including at least one of a loudspeaker, vibration actuator, light-emitting diode or display device coupled to the apparatus. In these examples, the circuitry may be configured to output the feedback signal to the output user interface, such as to warn the user that the detected sound level of the users voice, as measured by the (first) microphone, has exceeded the threshold sound level as detected by the other (second) microphone.

In some examples, the circuitry may be configured to output the second audio signal for communication to the telecommunications device to be carried by a telephone call therefrom. In these examples, the circuitry may be configured to output the feedback signal to cause the telecommunications device to terminate the telephone call, such as in instances in which the detected sound level of the user's voice, as measured by the (first) microphone, has exceeded the threshold sound level as detected by the other (second) microphone.

In some further examples, the instance(s) in which the circuitry is configured to produce the feedback signal may include one or more first instances and a next instance thereafter in each of which the first sound level is greater than the threshold sound level. In these further examples, the circuitry may be configured to output the feedback signal to the output user interface in each of the one or more first instances, and output the feedback signal to cause the telecommunications device to terminate the telephone call in the next instance thereafter.

According to another aspect of example implementations of the present disclosure, an apparatus is provided for use by a user to effect voice communication in a sound-restricted environment. In this aspect, the apparatus may include an amplifier and processor configured to carry out the functions described above with respect to the apparatus of the headset. The apparatus may be integrated with a headset such as described above, or may be separate from and coupled to a headset such as by way of a wireless or wired communication interface, which may further couple the apparatus to the telecommunications device or the sound recording device.

In yet another aspect of example implementations, a method is provided for a user to effect voice communication in a sound-restricted environment. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

Figure 1:
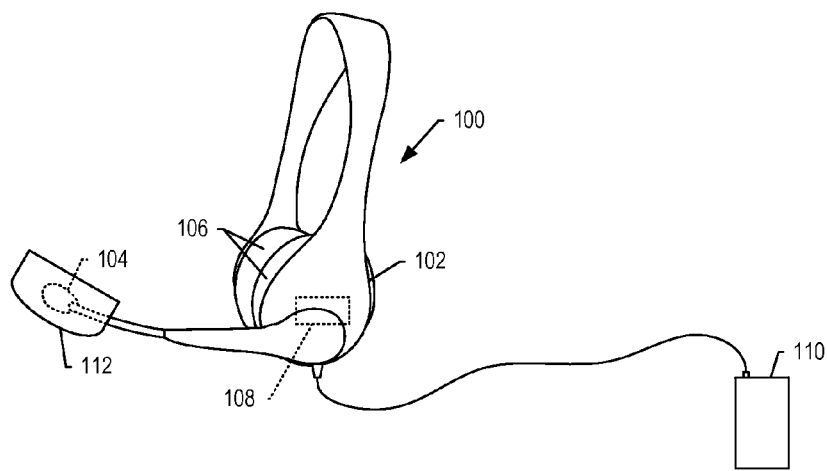
FIGS. 1 and 2 illustrate respective headsets including an integrated apparatus for use by a user to effect voice communication in a sound-restricted environment, in accordance with example implementations of the present disclosure.
Figure 2:
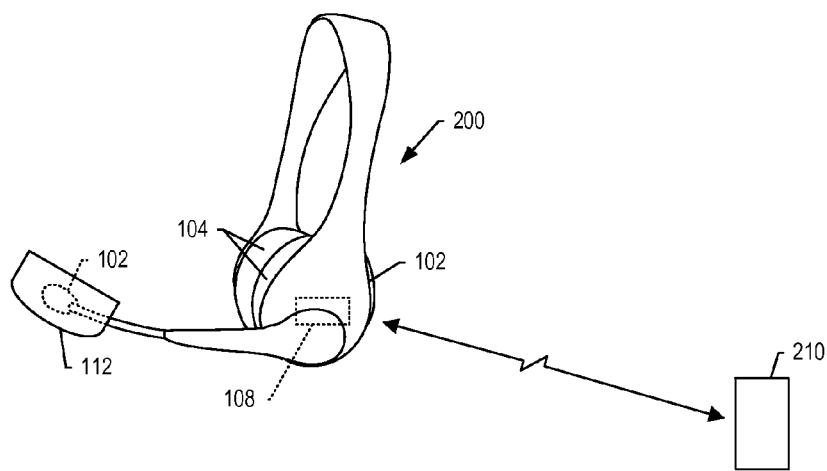
Figure 3:
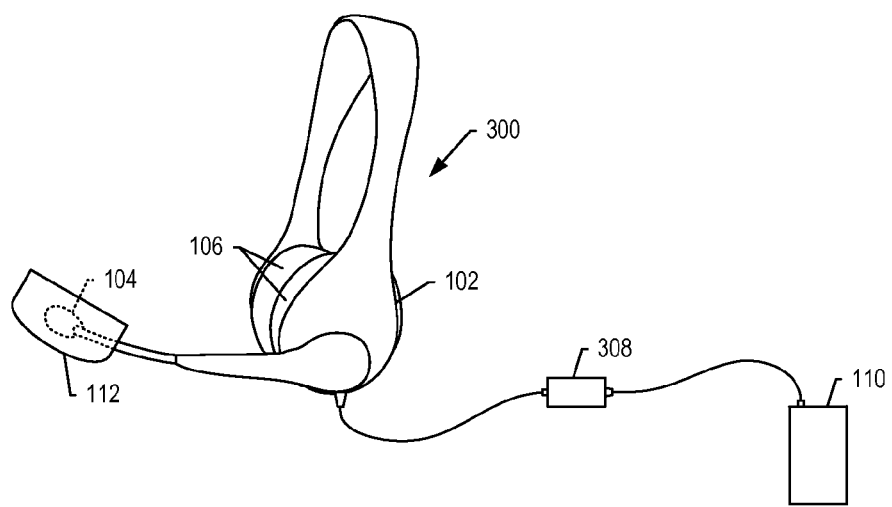
FIGS. 3 and 4 illustrate respective apparatuses separate from and coupled to an existing (e.g., standard) headset for use by a user to allow the user to effect voice communication in a sound-restricted environment with the now-augmented headset, in accordance with example implementations.
Figure 4:
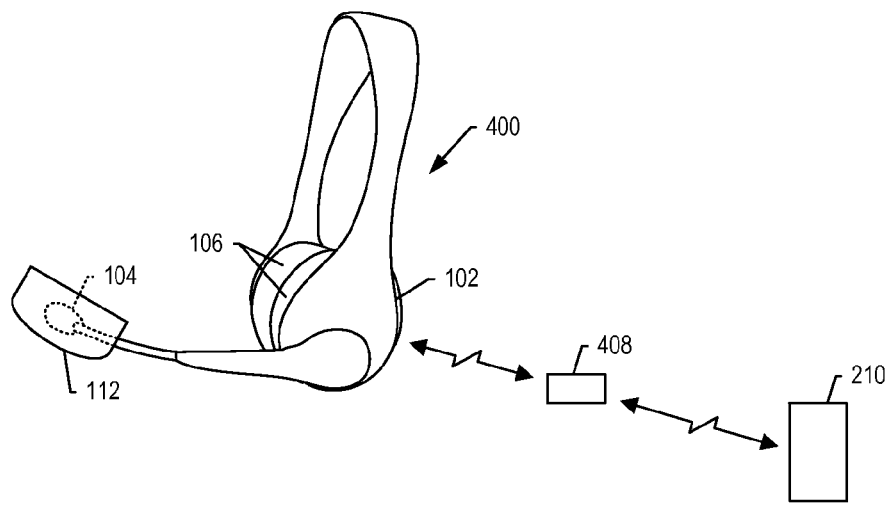
Figure 5:
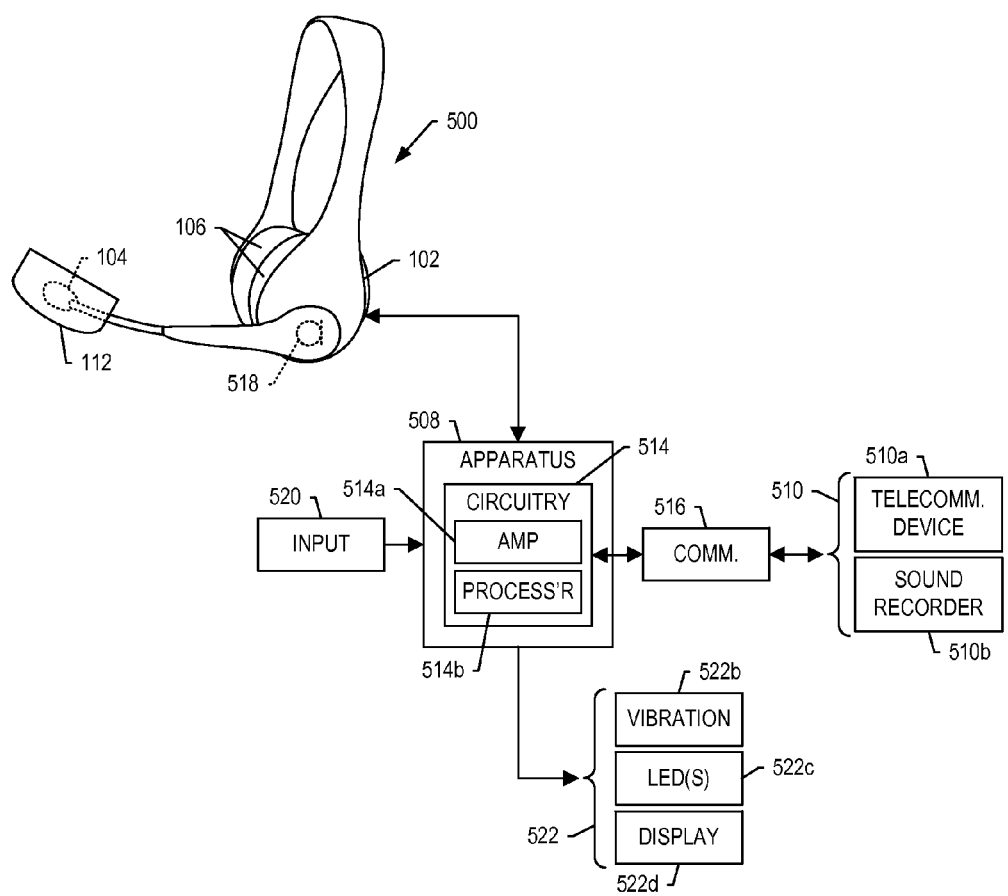
Figure 6:
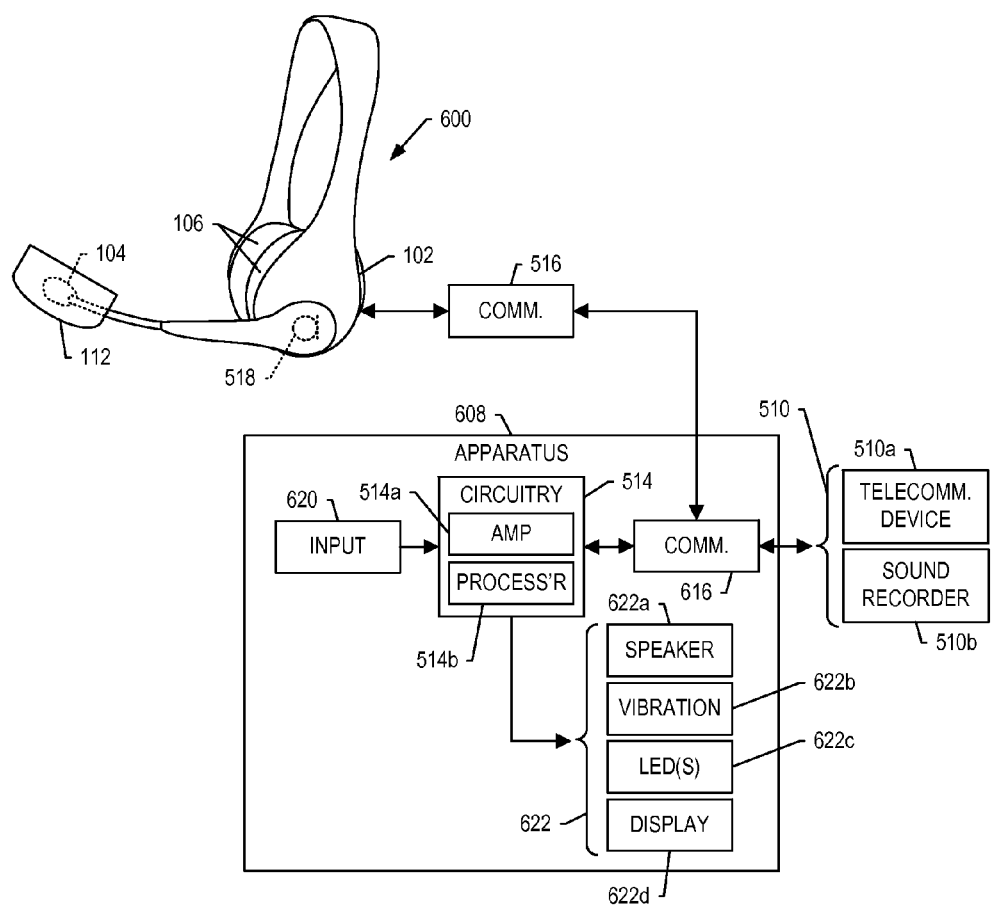
Figure 7:
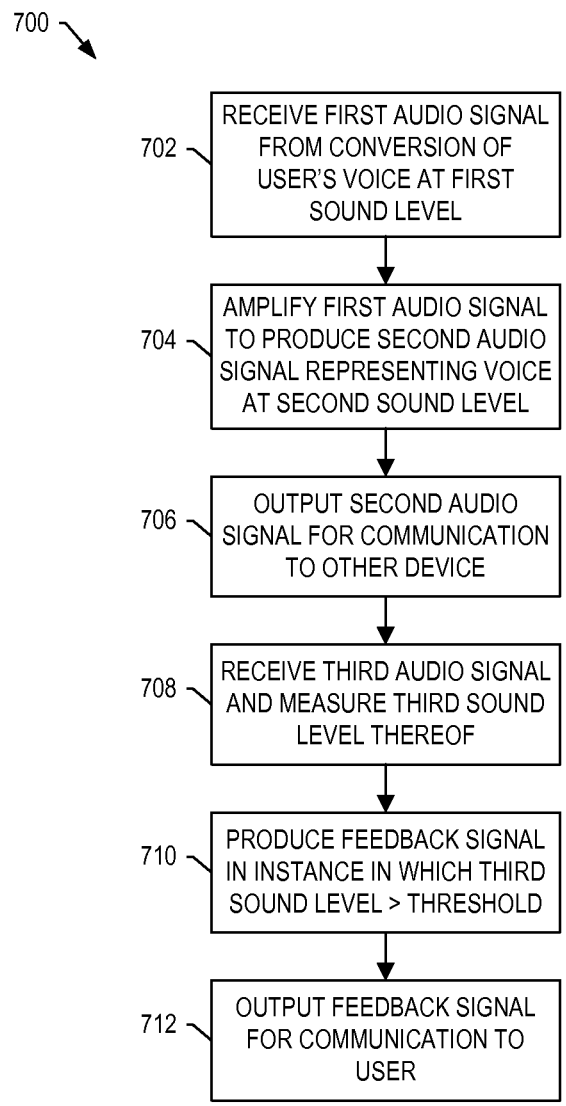

FIG. 5 more particularly illustrates the functional features of an apparatus contained within a headset that may correspond to the headset of either or both of FIG. 1 or 2, where the connection to the headset may be either wired or wireless, in accordance with example implementations;

FIG. 6 more particularly illustrates the functional features of an external apparatus add-on to a headset that may correspond to the apparatus of either or both of FIG. 3 or 4 where the connection to the headset may be either wired or wireless, in accordance with example implementations; and FIG. 7 illustrates various operations and typical operational flow in a method for a user to effect voice communication in a sound-restricted environment, in accordance with example implementations.

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Like reference numerals refer to like elements throughout.

Example implementations of the present disclosure are generally directed to an apparatus and method for use by a user to effect voice communication in a sound-restricted environment. A sound-restricted environment may generally include environments in which one may be prohibited or discouraged from using their mobile telephones to carry on a conversation, or may be otherwise prohibited or discouraged from speaking at a normal conversational level. Examples include use of mobile telephone devices onboard commercial vehicles like aircraft, trains, buses and the like, libraries, shared or common office environments, as well as mobile and/or desk-type telephone devices within office environments including cubicles or other partially-enclosed workspaces, and the like.

The apparatus of example implementations is primarily described herein for use with a headset that may be coupled to any of a number of different electronic devices such as a telecommunications device or a sound recording device via wired or wireless means. According to example implementations, the headset may include one or more of each of a number of components such as a microphone and headphones, similar to many conventional headsets. The headset may therefore allow the user hands-free operation in a manner that facilitates the user speaking at a level that may be inaudible to others outside a certain radius (e.g., one foot) of the user, and the user listening to any return audio (e.g., spoken by someone on the other end of a telephone call) at a manner whereby the return audio may be similarly inaudible. It should be understood, however, that the headset may more generally be a microphone or any of a number of different devices that include a microphone, including the telecommunications device or the sound recording device. The headset need not include a headphone or other loudspeaker. Likewise, the headset need not be designed to be held in place on or by its user's head or ears, and in some examples may instead be handheld.

As shown in FIGS. 1 and 2, some example implementations of the present disclosure may be provided by a headset 100, 200 for use by a user to effect voice communication in a sound-restricted environment. As shown, the headset may include a housing 102 that may support a microphone 104, and that may carry one or more headphones 106. The microphone may include or be embodied in any of a number of different types of acoustic-to-electric transducers configured to convert sound into an electrical signal, from the more general (e.g., condenser microphones) to the more application-specific (e.g., noise-canceling microphones). In some examples, the microphone may be attached to an arm supported by the housing, and which may be used to position and hold the microphone in place close to the user's mouth (sometimes referred to as a boom microphone). The headphones may likewise include or be embodied in any of a number of different types of electric-to-acoustic transducers configured to produce sound in response to an electrical (audio) signal. In some examples, the housing carrying the headphones may be designed to hold the headphones in place close to the user's ears.

The headset 100, 200 may include or be otherwise integrated with an apparatus 108, and may be coupled by wire (FIG. 1) or wirelessly (FIG. 2) to another device 110, 210 (e.g., telecommunications device, sound recording device). The other device 110, 210 may include or be embodied in one or more fixed or portable, hardware-based electronic devices. Examples of suitable electronic devices include a landline telephone, mobile telephone, smartphone, tablet computer, laptop computer, desktop computer and the like.

The apparatus 108 may include circuitry configured to carry out a number of functions, and in some examples, the apparatus may be powered by batteries carried by the headset (or the apparatus may be connectable to another power supply). In some examples, the apparatus may be further integrated with, and share the power supplied to, additional electronics utilized to filter out detected background noise around the user to provide both noise cancellation within the user's voice signal as well as the return sound being transmitted from the other end of the conversation into the headset headphones 106.

The apparatus may be generally configured to monitor the user's voice as they speak into the microphone 104 to effect voice communication through to the other device 110, 210. The apparatus may provide feedback to the user in instances in which the sound level of their voice exceeds a threshold, and amplify equivalent audio signals from the microphone to a sound level above the threshold (if not already thereabove) for communication to the other device. This threshold may be designed to keep the user's voice at a level that may be inaudible to others outside a certain radius (e.g., one foot) of the user. To aid in this effort, in some examples, the headset may further include a sound shield 112 disposed proximate the microphone and configured to at least partially muffle the user's voice from propagating beyond the microphone in the sound-restricted environment.

Other example implementations of the present disclosure may be provided by an apparatus similar to that shown in FIGS. 1 and 2, but that may be separate from and coupled in line between a headset and another device. The apparatus may include a housing to carry its circuitry in these example implementations, and in some examples, this housing may also carry batteries for powering the apparatus (or the apparatus may be connectable to another power supply). As shown in FIGS. 3 and 4, for example, a headset 300, 400 may be coupled by wire (FIG. 3) or wirelessly (FIG. 4) to an apparatus 308, 408, which may in turn be coupled by wire or wirelessly to another device 110, 210. Although shown as being all wired or wireless, in some examples, the headset may be coupled by wire to the apparatus, which may in turn be wirelessly coupled to the other device; or the headset may be wirelessly coupled to the apparatus, which may in turn be coupled by wire to the other device. And in even further example implementations, the apparatus may be included or otherwise integrated with the other device, which may in turn be coupled by wire or wirelessly to a headset (e.g., headset 300, 400).

FIG. 5 illustrates a headset 500 including or otherwise integrated with an apparatus 508, which may correspond to the headset 100, 200 and apparatus 108 of either or both FIG. 1 or FIG. 2, according to some example implementations of the present disclosure. As shown, the headset may include a housing 102 that may support a microphone 104, and that may carry one or more headphones 106. The headset with the apparatus may be coupled by wire or wirelessly to another device 510 (e.g., other device 110, 210) such as a telecommunications device 510*a* or sound recording device 510*b*.

As shown, the apparatus 508 may include circuitry 514 such as an amplifier 514*a* and a processor 514*b*. The amplifier 514*a* is generally any piece of hardware that is capable of amplifying a signal. The processor 514*b* is generally any piece of hardware that is capable of processing information such as, for example, electrical signals, data, computer-readable program code, instructions and the like (generally "computer programs," e.g., software, firmware, etc.), and/or other suitable electronic information.

The processor 514*b* is composed of an electronic circuit or a collection of electronic circuits some of which may be packaged as an integrated circuit or multiple interconnected integrated circuits (an integrated circuit at times more commonly referred to as a "chip"). In some more particular examples, the processor may be embodied as or otherwise include one or more application-specific integrated circuits (ASICs), field-programmable gate arrays (FPGAs) and the like. In some examples, the processor may be configured to execute computer programs, which may be stored in memory onboard or otherwise coupled to the processor. Thus, while the processor may be configured to perform one or more functions without the aid of a computer program, the processor of various examples may be configured to execute a computer program to perform one or more functions.

The microphone 104 may be configured to convert the user's voice at a first sound level to produce a first audio signal. The circuitry 514 (e.g., amplifier 514*a*) may be configured to receive the first audio signal. The circuitry (e.g., amplifier) may amplify the first audio signal to produce a second audio signal representing an audio signal produced by conversion of the user's voice at a greater, second sound level by the microphone. The circuitry (e.g., amplifier) may be configured to then output the second audio signal for communication to the other device 510. To this end, the headset may also include a wireless or wired communication interface 516 configured to communicate the second audio signal to the other device.

The communication interface 516 and other communication interfaces described herein may be configured to transmit and/or receive information by physical (wired), and/or wireless communications links. These wireless communication links in particular may be configured to implement any of a number of different radio access technologies such as any of a number of 3GPP or 4GPP radio access technologies, UMTS UTRA, GSM radio access technologies, CDMA 2000 radio access technologies, WLANs (e.g., IEEE 802.xx, e.g., 802.11a, 802.11b, 802.11g, 802.11n), WiMAX, IEEE 802.16, wireless PANs (WPANs) (e.g., IEEE 802.15, Bluetooth®, low power versions of Bluetooth®, IrDA, UWB, Wibree, Zigbee®), near-field communication technologies, and the like.

The circuitry 514 (e.g., processor 514*b*) may also be configured to receive a third audio signal and measure a third sound level thereof, produce a feedback signal in at least one instance in which the third sound level is greater than a threshold sound level that is less than the second sound level, and output the feedback signal for communication to the user. The threshold sound level may be set in any of a number of different manners, and it may be fixed or dynamic. The threshold sound level may be designed to keep the user's voice at a level that may be inaudible to others outside a certain radius (e.g., one foot) of the user, and in some examples, the sound shield 112 may aid in this effort. In some examples, the threshold sound level may be a calculated or measured sound level at the microphone (with or without the sound shield) that will produce no greater than a desired sound level at a certain radius from the microphone.

In some examples, the third audio signal and third sound level may be the same as the first audio signal and first sound level, and in other examples they may be different. In some examples the headset 500 may include or may be fitted to include another microphone 518 such as for noise cancellation in its headphones 106. In these examples, the feedback signal may be produced based on sound picked up by this microphone instead of from the microphone 104 into which the user may speak. In some examples, then, the third audio signal and third sound level from the other microphone may be different from the first audio signal and first sound level from the microphone into which the user may speak.

In an example incorporating another microphone 518, the other microphone may be configured to convert background noise to produce the third audio signal. The circuitry 514

(e.g., processor 514b), then, may be configured to measure the third sound level from a portion of the background noise including the user's voice at the third sound level. In some instances, the user's voice may already be at least partially muffled by the sound shield 112. And in some even further examples, the other microphone may be used by the circuitry to measure an overall background sound level from the background noise, with which a dynamic threshold sound level may have a direct relationship.

In some examples, the headset 500 may include an input user interface 520 coupled to the apparatus 508, and which may be configured to receive user-selection of the threshold sound level from a plurality of possible threshold sound levels. Additionally or alternatively, the input user interface may be configured to receive user-selection of the second sound level from a plurality of possible second sound levels.

Additionally or alternatively, the headset 500 may include an output user interface 522 including at least one loudspeaker (e.g., headphones 106), vibration actuator 522b, light-emitting diode (LED) 522c or display device 522d coupled to the apparatus 508. In these examples, the circuitry 514 (e.g., processor 514b) may be configured to output the feedback signal to the output user interface.

In some examples, the circuitry 514 (e.g., amplifier 514a) may be configured to output the second audio signal for communication to the telecommunications device 510a to be carried by a telephone call therefrom. In these examples, the circuitry (e.g., processor 514b) may be configured to output the feedback signal to cause the telecommunications device to terminate the telephone call.

In some further examples, it may be desirable to communicate one or more warnings to the user before terminating their telephone call. In these examples, the instance(s) in which the circuitry 514 (e.g., processor 514b) is configured to produce the feedback signal may include one or more first instances and a next instance thereafter in each of which the first sound level is greater than the threshold sound level. In these further examples, the circuitry may be configured to output the feedback signal to the output user interface 522 in each of the one or more first instances (e.g., as warnings), and output the feedback signal to cause the telecommunications device 510a to terminate the telephone call in the next instance thereafter.

FIG. 6 illustrates an apparatus 608 separate from and coupled to a headset 600, which may correspond to the apparatus 308, 408 and headset 300, 400 of either or both FIG. 3 or FIG. 4, according to some example implementations of the present disclosure. As shown, the example implementation of FIG. 6 may be similar to that of FIG. 5 but in which the apparatus and headset may at least partially differ between the example implementations to account for their being separate (FIG. 6) instead of integrated (FIG. 5). In this regard, as shown in FIG. 6, the apparatus 608 may be coupled by wire or wirelessly (or some combination) in line between the headset and the other device 510. Similar to the example implementation of FIG. 5, the headset 600 may include a wireless or wired communication interface 516. This communication interface may couple the headset to the apparatus, which may include a similar wireless or wired communication interface 616 for this purpose. The same or another wireless or wired communication interface of the apparatus may then couple the apparatus to the other device.

In some examples, the apparatus 608 may include an input user interface 620 coupled to its circuitry 514 (e.g., processor 514b), and which may be configured to receive user-selection of the threshold sound level from a plurality of possible threshold sound levels. Additionally or alternatively, the input user interface of the apparatus may be configured to receive user-selection of the second sound level from a plurality of possible second sound levels. In other examples, the apparatus may utilize an input user interface of the headset for this purpose, similar to the example described above with respect to the input user interface 520 of FIG. 5. These inputs may be provided by the user though either mechanical means (e.g., push buttons, switches, rotating knobs, etc.) or by voice recognition though the microphone 104 into which the user may speak.

In some examples, the feedback signal may be output by the circuitry 514 (e.g., processor 514b) to an output user interface, such as an output user interface of the headset 600 similar to the output user interface 522 of FIG. 5. Additionally or alternatively, the apparatus may itself include an output user interface 522 including at least one loudspeaker 622a, vibration actuator 622b, LED 622c or display device 622d coupled to the apparatus 508. In these examples, the apparatus 608 may be configured to output the feedback signal to the output user interface of the headset and/or apparatus itself.

FIG. 7 illustrates various operations in a method 700 for a user to effect voice communication in a sound-restricted environment. The method may include receiving a first audio signal produced by conversion of the user's voice at a first sound level by a microphone 104, and amplifying (by an amplifier) the first audio signal to produce a second audio signal representing an audio signal produced by conversion of the user's voice at a greater, second sound level by the microphone, as shown at blocks 702, 704. The method may include outputting the second audio signal for communication to another device 110, 210, 510 such as a telecommunications device 510a or sound recording device 510b, as shown at block 706.

The method 700 may also include receiving a third audio signal and measure a third sound level thereof, as shown at block 708. The method may include producing a feedback signal in at least one instance in which the third sound level is greater than a threshold sound level that is less than the second sound level, as shown at block 710. Here, the third audio signal and third sound level being the same as or different from the first audio signal and first sound level. And the method may include outputting the feedback signal for communication to the user, as shown at block 712.

Many modifications and other implementations of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A headset for use by a user to effect voice communication in a sound-restricted environment, the headset comprising:

a housing;
a microphone supported by the housing and configured to convert the user's voice at a first sound level to produce a first audio signal;
an apparatus including circuitry carried by the housing and configured to receive the first audio signal, the circuitry being configured to amplify the first audio signal to produce a second audio signal representing an audio signal produced by conversion of the user's voice at a greater, second sound level by the microphone, and output the second audio signal for communication to at least one of a telecommunications device or a sound recording device,
wherein the circuitry is also configured to receive a third audio signal and measure a third sound level thereof, produce a feedback signal in at least one instance in which the third sound level is greater than a threshold sound level that is less than the second sound level, and output the feedback signal for communication to the user, the third audio signal and third sound level being the same as or different from the first audio signal and first sound level; and
a wireless or wired communication interface configured to communicate the second audio signal to the telecommunications device or the sound recording device.

2. The headset of claim 1 further comprising a sound shield disposed proximate the microphone and configured to at least partially muffle the user's voice from propagating beyond the microphone in the sound-restricted environment.

3. The headset of claim 1 further comprising an input user interface coupled to the apparatus, and configured to receive user-selection of at least one of the threshold sound level from a plurality of possible threshold sound levels, or the second sound level from a plurality of possible second sound levels.

4. The headset of claim 1, wherein the third audio signal and third sound level are the same as the first audio signal and first sound level.

5. The headset of claim 1, wherein the third audio signal and third sound level are different from the first audio signal and first sound level, and the headset further comprises another microphone configured to convert background noise to produce the third audio signal, and
wherein the circuitry being configured to measure the third sound level includes being configured to measure the third sound level from a portion of the background noise including the user's voice at the third sound level.

6. The headset of claim 1 further comprising an output user interface including at least one of a loudspeaker, vibration actuator, light-emitting diode or display device coupled to the apparatus,
wherein the circuitry being configured to output the feedback signal includes being configured to output the feedback signal to the output user interface.

7. The headset of claim 1, wherein the circuitry is configured to output the second audio signal for communication to the telecommunications device to be carried by a telephone call therefrom, and
wherein the circuitry being configured to output the feedback signal includes being configured to output the feedback signal to cause the telecommunications device to terminate the telephone call.

8. The headset of claim 7 further comprising an output user interface including at least one of a loudspeaker, vibration actuator, light-emitting diode or display device coupled to the apparatus,
wherein the at least one instance includes one or more first instances and a next instance thereafter in each of which the first sound level is greater than the threshold sound level,
wherein the circuitry being configured to output the feedback signal includes being configured to output the feedback signal to the output user interface in each of the one or more first instances, and output the feedback signal to cause the telecommunications device to terminate the telephone call in the next instance thereafter.

9. An apparatus for use by a user to effect voice communication in a sound-restricted environment, the apparatus comprising:
an amplifier configured to receive a first audio signal produced by conversion of the user's voice at a first sound level by a microphone, the amplifier being configured to amplify the first audio signal to produce a second audio signal representing an audio signal produced by conversion of the user's voice at a greater, second sound level by the microphone, and output the second audio signal for communication to at least one of a telecommunications device or a sound recording device; and
a processor configured to receive a third audio signal and measure a third sound level thereof, produce a feedback signal in at least one instance in which the third sound level is greater than a threshold sound level that is less than the second sound level, and output the feedback signal for communication to the user, the third audio signal and third sound level being the same as or different from the first audio signal and first sound level.

10. The apparatus of claim 9 further comprising a wireless or wired communication interface coupled to the amplifier and processor, and configured to couple the apparatus to at least one of a headset including the microphone to receive the first audio signal from the microphone, or the telecommunications device or the sound recording device for communication of the second audio signal to the telecommunications device or the sound recording device.

11. The apparatus of claim 9 further comprising an input user interface coupled to the processor, and configured to receive user-selection of at least one of the threshold sound level from a plurality of possible threshold sound levels, or the second sound level from a plurality of possible second sound levels.

12. The apparatus of claim 9, wherein the third audio signal and third sound level are the same as the first audio signal and first sound level.

13. The apparatus of claim 9, wherein the third audio signal and third sound level are different from the first audio signal and first sound level,
wherein the processor being configured to receive the third audio signal includes being configured to receive the third audio signal produced by conversion of background noise by another microphone, and
wherein the processor being configured to measure the third sound level includes being configured to measure the third sound level from a portion of the background noise including the user's voice at the third sound level.

14. The apparatus of claim 9, wherein the processor being configured to output the feedback signal includes being configured to output the feedback signal to an output user interface including at least one of a loudspeaker, vibration actuator, light-emitting diode or display device.

15. The apparatus of claim 9, wherein the amplifier is configured to output the second audio signal for communication to the telecommunications device to be carried by a telephone call therefrom, and wherein the processor being configured to output the feedback signal includes being configured to output the feedback signal to cause the telecommunications device to terminate the telephone call.

16. The apparatus of claim 15, wherein the at least one instance includes one or more first instances and a next instance thereafter in each of which the first sound level is greater than the threshold sound level,
wherein the processor being configured to output the feedback signal includes being configured to output the feedback signal to an output user interface including at least one of a loudspeaker, vibration actuator, light-emitting diode or display device in each of the one or more first instances, and output the feedback signal to cause the telecommunications device to terminate the telephone call in the next instance thereafter.

17. A method for a user to effect voice communication in a sound-restricted environment, the method comprising:
receiving a first audio signal produced by conversion of the user's voice at a first sound level by a microphone, amplifying the first audio signal to produce a second audio signal representing an audio signal produced by conversion of the user's voice at a greater, second sound level by the microphone, and outputting the second audio signal for communication to at least one of a telecommunications device or a sound recording device; and
receiving a third audio signal and measure a third sound level thereof, producing a feedback signal in at least one instance in which the third sound level is greater than a threshold sound level that is less than the second sound level, and outputting the feedback signal for communication to the user, the third audio signal and third sound level being the same as or different from the first audio signal and first sound level.

18. The method of claim 17 further comprising receiving user-selection of at least one of the threshold sound level from a plurality of possible threshold sound levels, or the second sound level from a plurality of possible second sound levels.

19. The method of claim 17, wherein the third audio signal and third sound level are the same as the first audio signal and first sound level.

20. The method of claim 17, wherein the third audio signal and third sound level are different from the first audio signal and first sound level,
wherein receiving the third audio signal includes receiving the third audio signal produced by conversion of background noise by another microphone, and
wherein measuring the third sound level includes measuring the third sound level from a portion of the background noise including the user's voice at the third sound level.

21. The method of claim 17, wherein outputting the feedback signal includes outputting the feedback signal to an output user interface including at least one of a loudspeaker, vibration actuator, light-emitting diode or display device.

22. The method of claim 17, wherein the second audio signal is output for communication to the telecommunications device to be carried by a telephone call therefrom, and
wherein outputting the feedback signal includes outputting the feedback signal to cause the telecommunications device to terminate the telephone call.

23. The method of claim 22, wherein the at least one instance includes one or more first instances and a next instance thereafter in each of which the first sound level is greater than the threshold sound level,
wherein outputting the feedback signal includes outputting the feedback signal to an output user interface including at least one of a loudspeaker, vibration actuator, light-emitting diode or display device in each of the one or more first instances, and outputting the feedback signal to cause the telecommunications device to terminate the telephone call in the next instance thereafter.

* * * * *